(12) United States Patent
Kitamura et al.

(10) Patent No.: US 8,907,484 B2
(45) Date of Patent: Dec. 9, 2014

(54) SEMICONDUCTOR DEVICE AND METHOD FOR MANUFACTURING SAME

(71) Applicant: Kabushiki Kaisha Toshiba, Minato-ku, Tokyo (JP)

(72) Inventors: Masayuki Kitamura, Mie-ken (JP); Atsuko Sakata, Mie-ken (JP); Takeshi Ishizaki, Aichi-ken (JP); Satoshi Wakatsuki, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/018,645

(22) Filed: Sep. 5, 2013

(65) Prior Publication Data
US 2014/0284801 A1 Sep. 25, 2014

(30) Foreign Application Priority Data
Mar. 22, 2013 (JP) ................................. 2013-061148

(51) Int. Cl.
*H01L 23/48* (2006.01)
*H01L 23/532* (2006.01)
*H01L 21/768* (2006.01)

(52) U.S. Cl.
CPC .... *H01L 21/76838* (2013.01); *H01L 23/53261* (2013.01); *H01L 23/53209* (2013.01)
USPC ........................................ 257/757; 438/656

(58) Field of Classification Search
CPC .................. H01L 21/76838; H01L 21/76852; H01L 23/53527; H01L 23/53261; H01L 23/53266
USPC ........................................... 257/757; 438/656
See application file for complete search history.

(56) References Cited

U.S. PATENT DOCUMENTS 7,109,109 B2 * 9/2006 Shim et al. .................... 438/638
2009/0184421 A1 7/2009 Oshida et al.

FOREIGN PATENT DOCUMENTS

| JP | 2002-299343 | 10/2002 |
|---|---|---|
| JP | 2005-38999 | 2/2005 |
| JP | 2009-231588 | 10/2009 |

OTHER PUBLICATIONS

Steinhoegl et al., "Scaling Laws for the Resistivity Increase of sub-100 nm Interconnects," IEEE (2003), pp. 27-30.

* cited by examiner

*Primary Examiner* — Tu-Tu Ho
(74) *Attorney, Agent, or Firm* — Finnegan, Henderson, Farabow, Garrett & Dunner, L.L.P.

(57) ABSTRACT

According to an embodiment, a semiconductor device, includes a substrate, an inter-layer insulating layer provided above the substrate, a first interconnect provided in a first trench, and a second interconnect provided in a second trench. The first interconnect is made of a first metal, and the first trench is provided in the inter-layer insulating layer on a side opposite to the substrate. The second interconnect is made of a second metal, and the second trench is provided in the inter-layer insulating layer toward the substrate. A width of the second trench is wider than a width of the first trench. A mean free path of electrons in the first metal is shorter than a mean free path of electrons in the second metal, and the first metal is a metal, an alloy or a metal compound, including at least one nonmagnetic element as a constituent element.

20 Claims, 4 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2013-061148, filed on Mar. 22, 2013; the entire contents of which are incorporated herein by reference.

FIELD

Embodiments are generally related to a semiconductor device and a method for manufacturing the same.

BACKGROUND

Semiconductor devices such as system LSIs, semiconductor memory devices, etc., have a cell region where semiconductor elements are arranged in an array configuration, and a peripheral circuit that controls the semiconductor elements in the cell region from a peripheral region. Downscaling of the semiconductor elements and multilayering of the interconnect structure are progressing to increase an integration degree of the semiconductor device. For example, such a semiconductor memory device has a memory cell region including the semiconductor memory elements, a peripheral circuit region including a circuit at the periphery of the memory cell region to control the semiconductor memory elements in the memory cell region, and a multilayered interconnect structure at the upper portions of the memory cell region and the peripheral circuit region. Each of the interconnect layers of the multilayered interconnect structure includes interconnects (hereinbelow, called cell region interconnects) that are drawn out from the elements inside the memory cell region and interconnects (hereinbelow, called peripheral region interconnects) that are drawn out from the peripheral circuit in the peripheral circuit region. Downscaling progresses for the semiconductor memory element and the cell region interconnect as the memory capacity of the semiconductor memory device is increased. As a result, the electric resistance of the cell region interconnect increases; and the delay of control signals inside the memory cell region and the increase of heat generation may occur due to the increased interconnect resistance. Although there is a method in which a metal having a short mean free path is used to suppress the increase of the resistance of the cell region interconnect, the increase of the resistance of the peripheral region interconnect is problematic.

DETAILED DESCRIPTION

According to an embodiment, a semiconductor device, includes a substrate, an inter-layer insulating layer provided above the substrate, a first interconnect provided in a first trench, and a second interconnect provided in a second trench. The first interconnect is made of a first metal, and the first trench is provided in a direction toward the substrate from a front surface of the inter-layer insulating layer on a side opposite to the substrate. The second interconnect is made of a second metal, and the second trench is provided in a direction from the front surface of the inter-layer insulating layer toward the substrate. A width of the second trench is wider than a width of the first trench. A mean free path of electrons in the first metal is shorter than a mean free path of electrons in the second metal, and the first metal is a metal, an alloy or a metal compound, including at least one nonmagnetic element as a constituent element.

Various embodiments will be described hereinafter with reference to the accompanying drawings. The drawings used in the descriptions of the embodiments are schematic for ease of description; and the configurations, dimensions, size relationships, etc., of the components in the drawings are not always limited to the illustrations when actually implemented and are modifiable as appropriate within ranges in which the effects of the invention are obtained. Although a semiconductor memory device is described as an example in the embodiments, the embodiments are applicable even in the case where a semiconductor device including another LSI is used.

First Embodiment

The structures of the main components of the semiconductor device according to a first embodiment and a method for manufacturing the semiconductor device will now be described using FIG. 1 to FIG. 5. FIG. 1 to FIG. 5 are schematic cross-sectional views showing a portion of the manufacturing processes of the semiconductor device according to the first embodiment.

Figure 5:
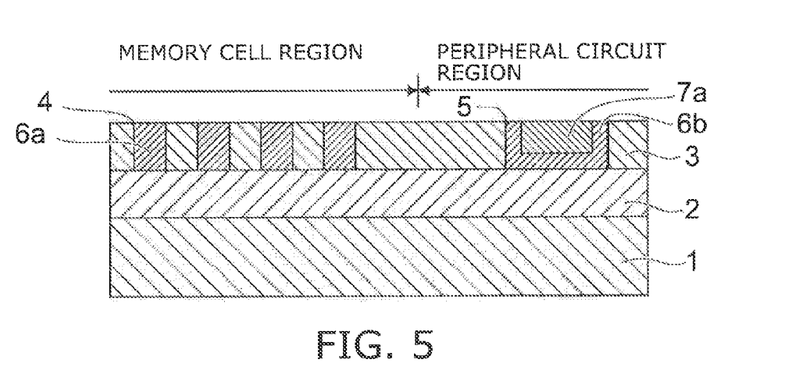

As shown in FIG. 5, the semiconductor device according to the embodiment includes a semiconductor substrate 1, a first inter-layer insulating layer 2, a second inter-layer insulating layer 3, a first interconnect 6a, and a second interconnect 7a.

The semiconductor substrate 1 is, for example, a silicon substrate. The semiconductor substrate 1 has a memory cell region, and a peripheral circuit region adjacent to the periphery of the memory cell region. Memory elements are formed in an array configuration in the memory cell region of the semiconductor substrate 1. Semiconductor elements of a peripheral circuit that drive or control the memory elements are formed in the peripheral circuit region.

The first interlayer insulating layer 2 is provided on the memory cell region and on the peripheral circuit region of the semiconductor substrate 1. The first inter-layer insulating layer 2 is, for example, silicon oxide, but may be silicon nitride.

The second inter-layer insulating layer 3 is provided on the first inter-layer insulating layer 2. The second inter-layer insulating layer 3 is, for example, silicon oxide, but may be silicon nitride. In the memory cell region of the semiconductor substrate 1, a first trench 4 is provided to pierce the second inter-layer insulating layer 3 from the front surface of the second inter-layer insulating layer 3 on the side opposite to the semiconductor substrate 1. The width (the width in a direction parallel to a front surface of the semiconductor substrate 1) of the first trench 4 is less than twice the thickness (the thickness in a direction perpendicular to the front surface of the semiconductor substrate 1) of the second inter-layer insulating layer 3.

The first interconnect 6a includes a first metal and is filled into the first trench 4. The first metal is a metal including at least one nonmagnetic element as a constituent element, for example, tungsten (W). Moreover, one selected from molybdenum (Mo), rhodium (Rh), iridium (Ir), zinc (Zn), ruthenium (Ru), Indium (In) and aluminum (Al) may be used instead of tungsten. Alternatively, the first metal may be an alloy including at least two selected from aluminum, rhodium, molybdenum, iridium, tungsten, zinc, ruthenium and indium.

The first metal may be a nonmagnetized alloy including a magnetic element and a nonmagnetic element. For example, the first metal includes one of iron (Fe), cobalt (Co) and nickel (Ni), and a nonmagnetic element. The first metal may be a nonmagnetic metal compound. Such a material may include an metallic compound, for example, a silicidized metal including at least one selected from iron (Fe), cobalt (Co) and nickel (Ni), such as NiSi, NiCoSi or the like. The nonmagnetic metal compound may also include an metallic compound such as boride, which includes at least one selected from iron (Fe), cobalt (Co) and nickel (Ni), and boron (B), for example, NIB or the like.

In the peripheral circuit region, a second trench 5 is provided to pierce the second inter-layer insulating layer 3 from the front surface of the second inter-layer insulating layer 3 on the side opposite to the semiconductor substrate 1. The width (the width in a direction parallel to the front surface of the semiconductor substrate 1) of the second trench 5 is wider than the width of the first trench 4.

To simplify the description in the drawings, the case is considered where the cross section of the first trench 4 and the cross section of the second trench 5 are parallel to each other in the page surface of the drawings. In other words, the case is considered where the first trench 4 and the second trench 5 extend in a direction perpendicular to the page surface. However, this is not limited thereto. The first trench 4 and the second trench 5 may extend in any direction in a plane parallel to the front surface of the semiconductor substrate 1.

Here, the width of the first trench 4 may be defined as the length of the first trench 4 in the horizontal direction (the direction parallel to the front surface of the semiconductor substrate 1) in the cross section of the first trench 4 perpendicular to the direction in which the first trench 4 extends. The case is considered where the first trench 4 extends in a direction perpendicular to the cross section defining the width of the first trench 4. This is considered to be similar for the second trench 5.

The second interconnect 7a includes a second metal and is filled into the second trench 5. The second metal is, for example, copper (Cu). The mean free path of electrons inside the second metal is longer than the mean free path of electrons inside the first metal previously described. Stated conversely, the first metal is a nonmagnetic and the mean free path of electrons inside the first metal is shorter than the mean free path of electrons inside the second metal.

Here, the widths of the first interconnect 6a and the second interconnect 7a are considered to be similar to the widths of the first trench 4 and the second trench 5. The first interconnect 6a extends in a direction perpendicular to the cross section of the first interconnect 6a defining the width of the first interconnect 6a. Similarly, the second interconnect extends in a direction perpendicular to the cross section of the second interconnect 7a defining the width of the second interconnect 7a.

As described above, the semiconductor device according to the embodiment includes one interconnect layer on the semiconductor substrate 1 that includes at least the first inter-layer insulating layer 2, the second inter-layer insulating layer 3, the first interconnect 6a, and the second interconnect 7a. Although a detailed description is omitted, the semiconductor device according to the embodiment has a multilayered interconnect structure by including a plurality of the interconnect layers recited above on the semiconductor substrate 1. The first interconnect 6a inside the multilayered interconnect structure is the cell region interconnect described above that is provided on the memory cell region of the semiconductor substrate 1 and is a word line, a bit line, a source line, or the like connected to a memory cell. The second interconnect 7a inside the multilayered interconnect structure is the peripheral region interconnect described above that is provided on the peripheral circuit region of the semiconductor substrate 1 and is electrically connected to the peripheral circuit. It is desirable for the first inter-layer insulating layer 2 and the second inter-layer insulating layer 3 to include a material having a low dielectric constant to suppress the parasitic capacitance to be small between each of the interconnects of the first interconnects 6a and the second interconnects 7a.

In the semiconductor device according to the embodiment, the second interconnect 7a is filled into the second trench 5 with a metal film 6b interposed, where the metal film 6b is made of the first metal. As described in the method for manufacturing the semiconductor device described below, the metal film 6b is provided in the case where the semiconductor device according to the embodiment is manufactured by using the method according to the embodiment. However, this is not limited thereto. In the case where a semiconductor device is manufactured by a method for manufacturing the semiconductor device according to a comparative example described below, the second interconnect 7a may be filled into the second trench 5 without the metal film 6b being interposed.

Features of the multilayered interconnect structure of the semiconductor device according to the embodiment will now be described. As the capacity of semiconductor memory increases, downscaling of the semiconductor elements and interconnects inside the memory cell region progresses; but compared to the memory cell region, downscaling of the semiconductor elements and interconnects may progresses to a lesser degree in the peripheral circuit region. Generally, copper has a small resistivity and a high thermal conductivity, and is used as the interconnects for the electrical connections between the semiconductor elements inside the semiconductor device. In the semiconductor memory device according to the embodiment as well, the second interconnect 7a of the peripheral circuit region includes copper as described above.

Conversely, as the capacity increases, an interconnect width that is smaller than that of the peripheral circuit region is provided in the memory cell region. In the case where the first interconnect 6a includes copper similarly to the second interconnect 7a, the resistivity of copper may increase abruptly when the width of the interconnect decreases to become equal to or less than some value. This phenomenon is so called the size effect. This effect occurs when the width of the interconnect becomes equivalent to or less than the mean free path of electrons of copper. In other words, this is because, as the width of the interconnect becomes smaller than the mean free path of electrons, the proportion of the electrons scattering at the sidewalls of the interconnect to the electrons having lattice scattering inside the copper crystal increases. For example, the mean free path of electrons due to the lattice scattering inside copper is about 40 nm. Therefore, the resistivity of the copper abruptly increases as the width of the interconnect becomes smaller than, for example, about 40 nm. Accordingly, in the case where copper is used as the first interconnect 6a of the memory cell region, the interconnect resistance undesirably increases abruptly for an interconnect width of, for example, about 40 nm or less.

In the semiconductor memory device according to the embodiment, the first interconnect 6a includes a metal having a smaller mean free path of electrons than the second interconnect 7a. For example, in the semiconductor memory device according to the embodiment, tungsten is used instead of copper. The mean free path of electrons of tungsten is smaller than that of copper. The width of the interconnect where the interconnect resistance starts to increase (the width of the interconnect where the wire effect becomes significant) as recited above is small for a metal having a small mean free path.

Furthermore, tungsten is a nonmagnetic metal. It is favorable that the first interconnect 6a and the second interconnect 7a are made of a nonmagnetic metal in a semiconductor device such as a semiconductor memory etc. which requires high speed operation, since a ferromagnetic material used for a radio-frequency interconnect may cause so called a skin effect, where electric current flowing prominently concentrates on a surface of the interconnect, leading to high resistance thereof.

A metal used for the first interconnect 6a may be a nonmagnetic alloy or a nonmagnetic metallic compound. For example, it is not limited to an alloy including a nonmagnetic element, and may be a nonmagnetized material by alloying a ferromagnetic metal and a nonmagnetic metal. Silicide, boride or the like, which includes iron (Fe), cobalt (Co) and nickel (Ni) are nonmagnetic, and may be used as a material of the first interconnect 6a.

When an alloy is used for the first interconnect 6a, the mean free path recited above refers to as a mean free path of electrons in the alloy. When an metallic compound is used for the first interconnect 6a, the mean free path recited above is a mean free path of electrons in the metallic compound.

Therefore, in the semiconductor memory device according to the embodiment, the resistivity of the second interconnect 7a of the peripheral region is small by using copper which is the second metal recited above. Further, by using tungsten which is the first metal recited above instead of copper as the first interconnect 6a of the memory cell region, the resistivity of the first interconnect 6a is maintained to be lower than that in the case where copper is used, and the width of the first interconnect 6a is reduced.

Restated, the first metal included in the first interconnect 6a, the second metal included in the second interconnect 7a, and the width of the first interconnect 6a are set such that the resistivity of the first interconnect 6a is lower than the resistivity of the second interconnect 7a, wherein a width of the first interconnect 6a and a width of the second interconnect 7a are the same as the width of the first trench 4 into which the first interconnect 6a is filled.

Figure 1:
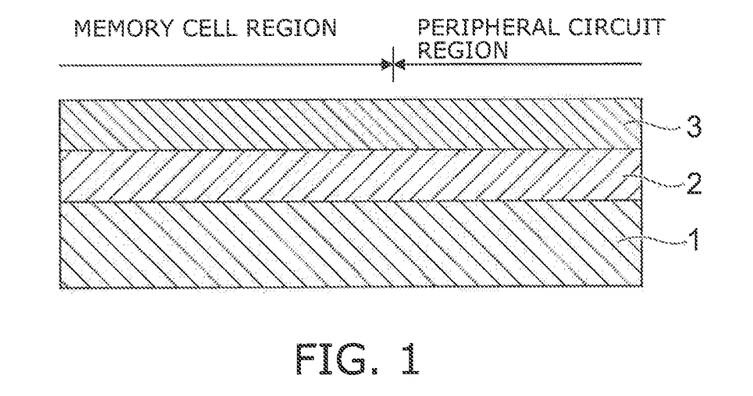
FIGS. 1 to 5 are schematic cross-sectional views showing a portion of a manufacturing processes of a semiconductor device according to a first embodiment.

A method for manufacturing the semiconductor memory device according to the embodiment will now be described. As shown in FIG. 1, the first inter-layer insulating layer 2 is formed on the semiconductor substrate 1 by, for example, CVD (Chemical Vapor Deposition). The first inter-layer insulating layer 2 is, for example, silicon oxide. The semiconductor substrate 1 has a memory cell region, and a peripheral circuit region disposed at the periphery of the memory cell region. In the memory cell region, the semiconductor elements that are used as memory cells are formed inside the semiconductor substrate 1. In the peripheral circuit region, a peripheral circuit that controls the memory cells is formed inside the semiconductor substrate 1. The first inter-layer insulating layer 2 includes not-shown contact vias that pierce the first inter-layer insulating layer 2 to reach the semiconductor elements inside the semiconductor substrate 1. The contact vias are conductors that draw out the electrodes of the semiconductor elements to the interconnect layer.

Then, the second inter-layer insulating layer 3 is provided on the first inter-layer insulating layer 2 in the memory cell region and the peripheral circuit region by, for example, CVD. The second inter-layer insulating layer 3 is, for example, silicon oxide.

Figure 2:
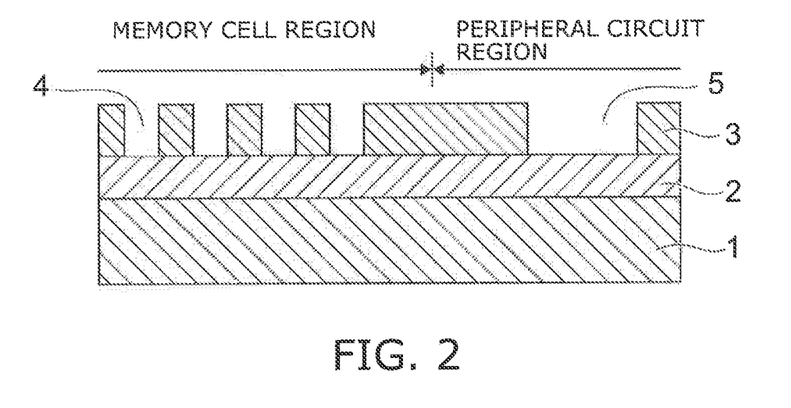

Continuing as shown in FIG. 2, the first trench 4 is made by, for example, RIE (Reactive Ion Etching) to pierce the second inter-layer insulating layer 3 from the front surface of the second inter-layer insulating layer 3 on the side opposite to the semiconductor substrate 1. The width of the first trench 4 is less than twice the thickness of the second inter-layer insulating layer 3. Simultaneously, the second trench 5 is made to pierce the second inter-layer insulating layer 3 from the front surface of the second inter-layer insulating layer 3 on the side opposite to the semiconductor substrate 1. The width of the second trench 5 is wider than the width of the first trench 4.

Silicon nitride may be provided as an etching stop layer between the first inter-layer insulating layer 2 and the second inter-layer insulating layer 3 to make the first trench 4 and the second trench 5 by the RIE recited above. In such a case, the first trench 4 and the second trench 5 are made to pierce the second inter-layer insulating layer 3 by etching the second inter-layer insulating layer 3 by RIE until the etching stop layer is exposed.

Figure 3:
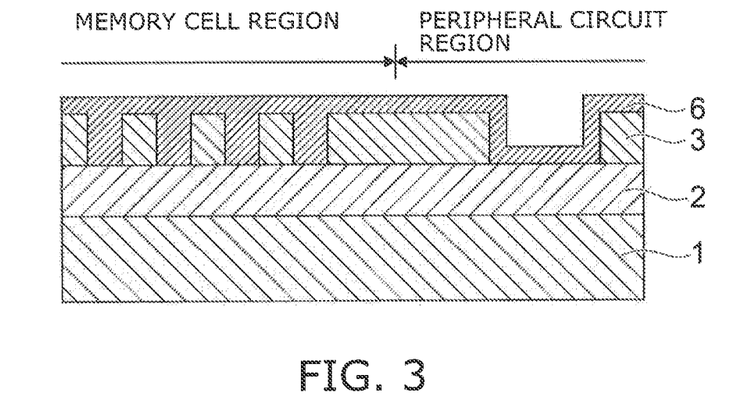

Then, as shown in FIG. 3, a first metal film 6 made of the first metal is formed to fill the first trench 4 and cover the front surface of the second inter-layer insulating layer 3 and the inner surface (the side wall and the bottom surface) of the second trench 5. The first metal is a metal which has a mean free path of electrons that is shorter than that of the second metal described below, for example, tungsten. The first metal film 6 (tungsten film) is formed by, for example, CVD using tungsten hexafluoride as a source material. Since the first metal film 6 is formed by vapor phase epitaxy such as CVD, etc., the first metal film 6 is formed with substantially the same thickness on the side wall of the first trench 4, the bottom surface of the first trench 4, the front surface of the second inter-layer insulating layer 3, the side wall of the second trench 5, and the bottom surface of the second trench 5.

Here, it is also possible to use molybdenum instead of tungsten. In the case where tungsten or molybdenum is formed as a film, it is also possible to form the tungsten or molybdenum after forming titanium (Ti) or titanium nitride (TiN) beforehand as a film on the front surfaces of the first inter-layer insulating layer 2 and the second inter-layer insulating layer 3 to provide good adhesion with the insulating film.

When the thickness of the first metal film 6 formed on the bottom surface of the second trench 5 becomes half of the width of the first trench 4, the first trench 4 is substantially filled completely with the first metal film 6. The first metal film 6 is formed such that the thickness of the first metal film 6 formed on the bottom surface of the second trench 5 is not less than half of the width of the first trench 4 and less than the film thickness of the second inter-layer insulating layer 3. Thereby, the second trench 5 is not filled completely with the first metal film 6 and the shape of the second trench 5 is maintained.

Figure 4:
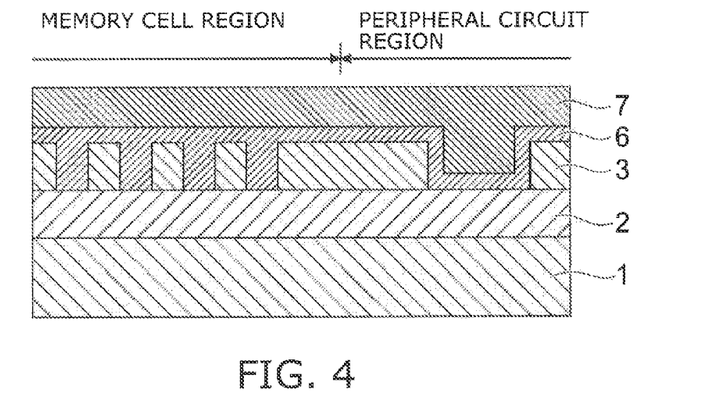

Then, as shown in FIG. 4, a second metal film 7, which is made of the second metal, is formed with the first metal film 6 interposed on the first trench 4, on the front surface of the second inter-layer insulating layer 3, on the side wall of the second trench 5, and on the bottom surface of the second trench 5. The second metal is a metal, e.g., copper, that has a mean free path of electrons that is longer than that of the first metal. The second metal film 7 is formed by plating from a seed of copper formed on the first metal film 6. Thereby, the second metal film 7 is formed with the first metal film 6 interposed on the first trench 4, on the front surface of the second inter-layer insulating layer 3, on the side wall of the second trench 5, and on the bottom surface of the second trench 5. The second metal film 7 is filled into the second trench 5 with the first metal film 6 interposed.

Continuing as shown in FIG. 5, the upper portion of the second metal film 7 and the upper portion of the first metal film 6 are removed by, for example, polishing the front surface of the second metal film 7 and the front surface of the first metal film 6 by CMP (Chemical Mechanical Polishing) until the front surface of the second inter-layer insulating layer 3 is exposed. As a result, the first interconnect 6a is formed of the first metal film 6 that fills the first trench 4. The second interconnect 7a is formed of the second metal film 7 that fills the second trench 5. The metal film 6b made of the first metal film 6 is formed between the first inter-layer insulating layer 2 and the second interconnect 7a and between the second inter-layer insulating layer 3 and the second interconnect 7a. It is also possible to remove the upper portion of the second metal film 7 and the upper portion of the first metal film 6 by etching the front surface of the second metal film 7 and the front surface of the first metal film 6 until the front surface of the second inter-layer insulating layer 3 is exposed by CDE (Chemical Dry Etching) instead of CMP.

Here, a barrier metal layer may be provided between the first metal film 6 and the second metal film 7 to prevent the second metal from diffusing from the second metal film 7 into the first inter-layer insulating layer 2 and the second inter-layer insulating layer 3. Or, a barrier metal layer may be used to diffuse another metal into the second metal film 7. In the embodiment, tungsten is used as the first metal; and copper is used as the second metal. In such a case, titanium (Ti), titanium nitride (TiN), tantalum (Ta), tantalum nitride (TaN), a stacked structure of titanium/titanium nitride (Ti/TiN), or a stacked structure of tantalum/tantalum nitride (Ta/TaN) may be used as a barrier layer between the first metal film 6 and the second metal film 7 to diffuse titanium or tantalum into the second metal film 7 (copper film).

One interconnect layer of the multilayered interconnect structure includes the first inter-layer insulating layer 2, the second inter-layer insulating layer 3, the first interconnect 6a, and the second interconnect 7a recited above. Thereafter, the multilayered interconnect structure is formed by multiply forming the interconnect layer recited above by repeating the processes shown in FIG. 1 to FIG. 5. The first interconnect 6a and the second interconnect 7a are electrically connected respectively to a semiconductor element inside the memory cell region and a semiconductor element inside the peripheral circuit region by being electrically connected to contact vias provided in the first inter-layer insulating layer 2 described above.

In the semiconductor device according to the embodiment, the first interconnect 6a and the second interconnect 7a are included in one interconnect layer. Therefore, the method for manufacturing the semiconductor device according to the embodiment includes: a process of simultaneously making the first trench 4 to pierce the second inter-layer insulating layer 3 and the second trench 5 to pierce the second inter-layer insulating layer 3, where the second trench 5 has a wider width than the first trench 4; a process of forming the first metal film 6 made of the first metal to fill the first trench 4 and cover the front surface of the second inter-layer insulating layer 3 and the side wall and bottom surface of the second trench 5; a process of forming the second metal film 7, which is made of the second metal, with the first metal film 6 interposed on the first trench 4, on the front surface of the second inter-layer insulating layer 3, and on the side wall and bottom surface of the second trench 5; and a process of removing the second metal film 7 and the first metal film 6 until the front surface of the second inter-layer insulating layer 3 is exposed. Thereby, in the method for manufacturing the semiconductor device according to the embodiment, it is possible to integrally form the first interconnect 6a and the second interconnect 7a without separately implementing a lithography process and a planarizing process to separately form the first interconnect 6a and the second interconnect 7a. Therefore, by the method for manufacturing the semiconductor device according to the embodiment, the production processes of the semiconductor device are reduced; and the production cost of the semiconductor device can be reduced.

A mean free path of electrons in a material of the first metal is shorter than a mean free path of electrons in a material of the second metal, and the material of the first metal is a metal, an alloy or a metal compound including at least one nonmagnetic element as a constituent element. Thereby, the first interconnect 6a including the first metal film suppresses a size effect and prevents increase of the resistance.

Conversely, a method for manufacturing a semiconductor device according to a comparative example will now be described using FIG. 6 to FIG. 12. FIG. 6 to FIG. 12 are schematic cross-sectional views showing a portion of the manufacturing processes of a semiconductor device according to the comparative example. For portions having the same configuration as the configuration described in the embodiment, the same reference numeral or symbol is used; and a description is omitted. Features that differ from the embodiment are mainly described.

Figure 6:
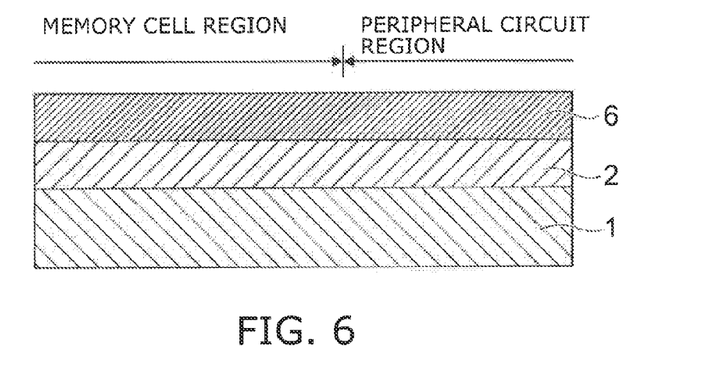
FIGS. 6 to 12 are schematic cross-sectional views showing a portion of the manufacturing processes of a semiconductor device according to a comparative example.

As shown in FIG. 6, the first inter-layer insulating layer 2 is formed by CVD on the semiconductor substrate 1 where the semiconductor elements are formed. Subsequently, the first metal film 6 made of the first metal is formed on the first inter-layer insulating layer 2 by CVD.

Figure 7:
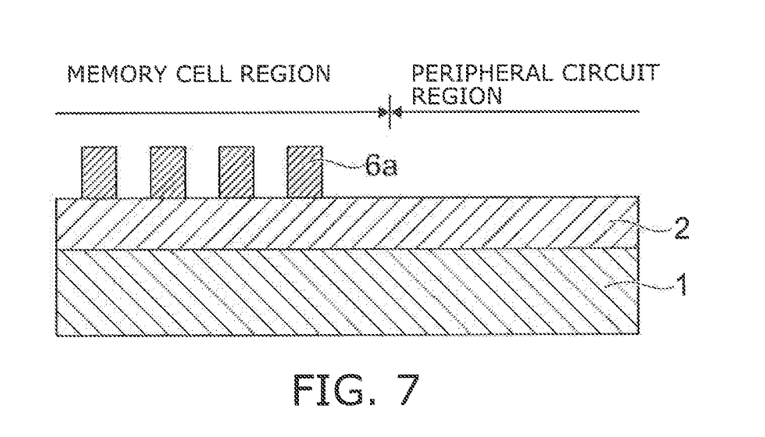

Then, as shown in FIG. 7, the first interconnect 6a is formed in the memory cell region to have the same width as the first interconnect 6a according to the embodiment described above by etching the first metal film 6 until the front surface of the first inter-layer insulating layer 2 is exposed by RIE using a not-shown mask.

Figure 8:
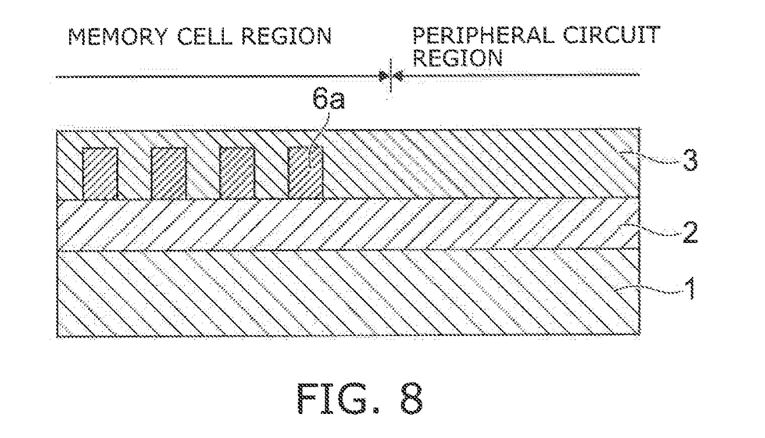

Continuing as shown in FIG. 8, the second inter-layer insulating layer 3 is formed on the first inter-layer insulating layer 2 and on the first interconnect 6a by, for example, CVD. The second inter-layer insulating layer 3 is formed until the thickness of the second inter-layer insulating layer 3 becomes thicker than the thickness of the first interconnect 6a in a direction perpendicular to the front surface of the semiconductor substrate 1. The first inter-layer insulating layer 2 and the second inter-layer insulating layer 3 are silicon oxide, which is the same as in the method for manufacturing the semiconductor device according to the embodiment recited above.

Figure 9:
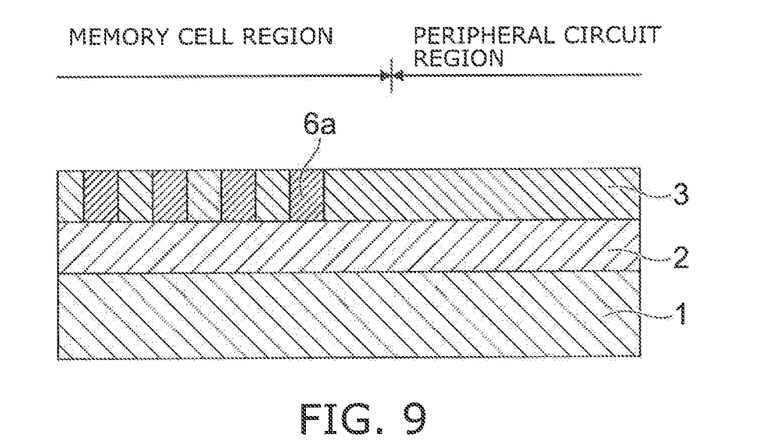

Then, as shown in FIG. 9, the front surface of the second inter-layer insulating layer 3 is polished by CMP until the upper end of the first interconnect 6a is exposed. It is also possible to use CDE instead of CMP.

Figure 10:
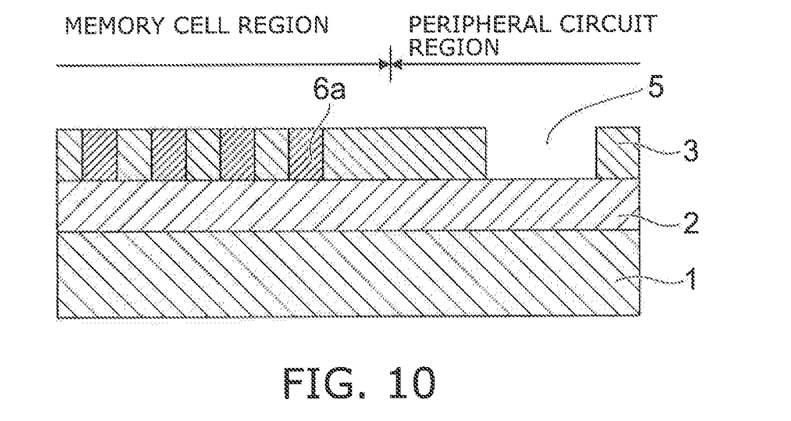

Continuing as shown in FIG. 10, the second trench 5 is made to pierce the second inter-layer insulating layer 3 from the front surface of the second inter-layer insulating layer 3 in the peripheral circuit region. The width of the second trench 5 is wider than the width of the first interconnect 6a.

Figure 11:
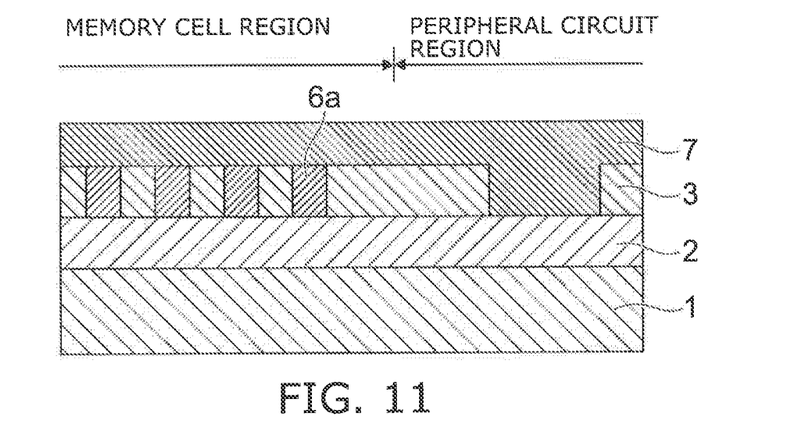

Then, the second metal film 7 is formed to cover the first interconnect 6a, the front surface of the second inter-layer insulating layer 3, the side wall of the second trench 5, and the bottom surface of the second trench 5. The second metal film 7 is formed such that the thickness of the second metal film 7 on the bottom surface of the second trench 5 becomes thicker than the thickness of the second inter-layer insulating layer 3.

Figure 12:
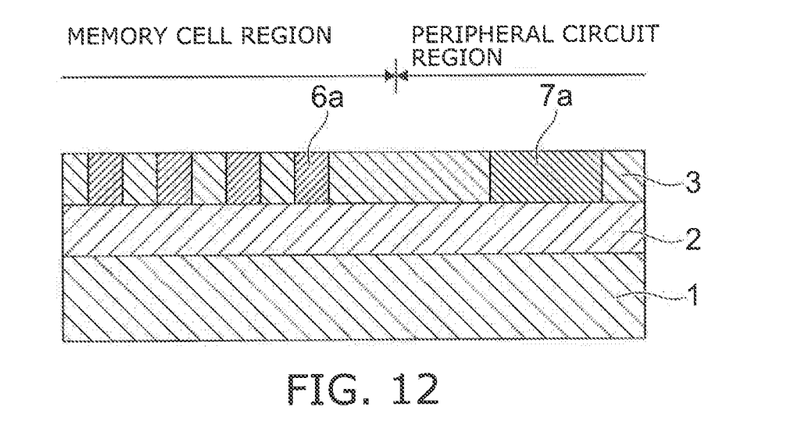

Continuing as shown in FIG. 12, the front surface of the second metal film 7 is polished by CMP until the upper end of the first interconnect 6a and the front surface of the second inter-layer insulating layer 3 are exposed. As a result, one interconnect layer includes the first inter-layer insulating layer 2, the second inter-layer insulating layer 3, the first interconnect 6a, and the second interconnect 7a. The first interconnect 6a is formed in the memory cell region of the interconnect layer; and the second interconnect 7a is formed in the peripheral circuit region of the interconnect layer. The multilayered interconnect structure is formed on the semiconductor substrate 1 by repeatedly forming the interconnect layer.

Compared to the method for manufacturing the semiconductor device according to the embodiment, the number of manufacturing processes of the method for manufacturing the semiconductor device according to the comparative example is greater because the first interconnect 6a and the second interconnect 7a are formed by separate manufacturing processes. As a result, the manufacturing cost is undesirably higher than that of the method for manufacturing the semiconductor device according to the embodiment.

In the embodiment, the first interconnect 6a and the second interconnect 7a are provided in the second inter-layer insulating layer 3 provided on the first inter-layer insulating layer 2, however the embodiment is not limited thereto. The first interconnect 6a and the second interconnect 7a may be formed, for example, in one inter-layer insulating layer provided on the semiconductor substrate 1.

A formula to calculate the amount of the increase of the interconnect resistance due to the size effect is reported by W. Steinhogl et al, proc. SI SPAIN 2003 and Phys. Rev. B66 (2002). According to the formula, the resistivity of a 20-nm copper interconnect becomes 10 $\mu\Omega\cdot cm$ when the resistivity of copper is 1.67 $\mu\Omega\cdot cm$, the interconnect width is 20 nm, the interconnect height is 50 nm, the particle size of copper is 40 nm, and the scattering rate at the grain boundary of copper is 0.72. Referring to this value, a metal is preferably used as the first metal, whose resistivity is 10 $\mu\Omega\cdot cm$ or less when the width of the interconnect is sufficiently large. In the case where the width of the interconnect is reduced to be 20 nm or less, and the resistivity of the first metal in the wider interconnect is greater than 10 $\mu\Omega\cdot cm$, the resistivity cannot be less than that of an interconnect having the same interconnect width and made of the second metal, e.g., copper.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a substrate;
    an inter-layer insulating layer provided above the substrate;
    a first interconnect provided in a first trench, and made of a first metal, the first trench being provided in a direction toward the substrate from a front surface of the inter-layer insulating layer on a side opposite to the substrate; and
    a second interconnect provided in a second trench, and made of a second metal, the second trench being provided in a direction from the front surface of the inter-layer insulating layer toward the substrate, a width of the second trench being wider than a width of the first trench,
    a mean free path of electrons in the first metal being shorter than a mean free path of electrons in the second metal, and the first metal being a metal, an alloy or a metal compound, including at least one nonmagnetic element as a constituent element.

2. The device according to claim 1, wherein the first metal includes at least one selected from aluminum, rhodium, molybdenum, iridium, tungsten, zinc, ruthenium and indium.

3. The device according to claim 1, wherein the first metal is an alloy or a metal compound, which includes at least one selected from iron, cobalt and nickel, and a nonmagnetic element.

4. The device according to claim 1, wherein the first metal is a silicide including at least one selected from iron, cobalt and nickel, or a boride including at least one selected from iron, cobalt and nickel.

5. The device according to claim 1, wherein the first metal is tungsten or molybdenum, and the second metal is copper.

6. The device according to claim 1, wherein a resistivity of the second interconnect is higher than a resistivity of the first interconnect when a width of the first interconnect and a width of the second interconnect are set to be the same as the width of the first trench.

7. The device according to claim 1, wherein the second interconnect is filled into the second trench with a metal film interposed, the metal film being made of the first metal.

8. The device according to claim 7, further comprising a barrier metal layer between the metal film and the second interconnect.

9. The device according to claim 8, wherein the barrier metal layer includes one selected from titanium, titanium nitride, tantalum, tantalum nitride, a stacked structure of titanium and titanium nitride, and a stacked structure of tantalum and tantalum nitride.

10. The device according to claim 7, wherein a thickness of the metal film made of the first metal inside the second trench is less than a depth of the second trench and not less than half of the width of the first trench.

11. The device according to claim 7, further comprising: a film including at least one of titanium and titanium nitride between the first interconnect and the inter-layer insulating layer and between the metal film and the inter-layer insulating layer.

12. The device according to claim 1, wherein
    the inter-layer insulating layer includes a first inter-layer insulating layer provided above the substrate and a second inter-layer insulating layer provided above the first inter-layer insulating layer, and
    each of the first trench and the second trench pierces the second inter-layer insulating layer, and is communicated with the first inter-layer insulating layer.

13. The device according to claim 12, wherein
    the second interconnect is filled into the second trench with a metal film interposed, the metal film being made of the first metal, and a thickness of the metal film made inside the second trench is less than a thickness of the second inter-layer insulating layer and not less than half of the width of the first trench.

14. The device according to claim 12, wherein the width of the first trench is less than twice a thickness of the second inter-layer insulating layer.

15. The device according to claim 1, wherein
the substrate has a memory cell region and a peripheral circuit region, the memory cell region including a memory element,
the first trench is provided above the memory cell region, and
the second trench is provided above the peripheral circuit region.

16. A method for manufacturing a semiconductor device, comprising:
forming an inter-layer insulating layer above a substrate;
forming a first trench and a second trench in a direction from a front surface of the inter-layer insulating layer toward the substrate, a width of the second trench being wider than a width of the first trench;
forming a first metal film made of a first metal to fill the first trench and cover the front surface of the inter-layer insulating layer, a side wall of the second trench, and a bottom surface of the second trench;
forming a second metal film with the first metal film interposed on the first trench, on the front surface of the inter-layer insulating layer, on the side wall of the second trench, and on the bottom surface of the second trench, the second metal film being made of a second metal; and removing the second metal film and the first metal film until the front surface of the inter-layer insulating layer is exposed,
a mean free path of electrons in the first metal being shorter than a mean free path of electrons in the second metal, and the first metal being a metal, an alloy or a metal compound, including at least one nonmagnetic element as a constituent element.

17. The method according to claim 16, wherein
a first interconnect made of the first metal film filling the first trench, a second interconnect made of the second metal film filling the second trench, and a metal film made of the first metal film between the inter-layer insulating layer and the second interconnect are formed by removing the second metal film and the first metal film until the front surface of the inter-layer insulating layer is exposed.

18. The method according to claim 16, wherein a barrier metal layer is formed on the first metal film after the forming of the first metal film and before the forming of the second metal film.

19. The method according to claim 18, wherein the barrier metal layer includes one selected from titanium, titanium nitride, tantalum, tantalum nitride, a stacked structure of titanium and titanium nitride, and a stacked structure of tantalum and tantalum nitride.

20. The method according to claim 16, wherein a film thickness of the first metal film formed on the bottom surface of the second trench is not less than half of the width of the first trench and less than a depth of the second trench.

* * * * *